(12) United States Patent
Brunco et al.

(10) Patent No.: US 8,354,344 B2
(45) Date of Patent: Jan. 15, 2013

(54) METHODS FOR FORMING METAL-GERMANIDE LAYERS AND DEVICES OBTAINED THEREBY

(75) Inventors: David Brunco, Hillsboro, OR (US); Marc Meuris, Keerbergen (BE)

(73) Assignee: IMEC, Leuven (BE)

( * ) Notice: Subject to any disclaimer, the term of this patent is extended or adjusted under 35 U.S.C. 154(b) by 376 days.

(21) Appl. No.: 12/201,948

(22) Filed: Aug. 29, 2008

(65) Prior Publication Data

US 2009/0085167 A1    Apr. 2, 2009

(30) Foreign Application Priority Data

Aug. 31, 2007    (EP) .................................. 07115482

(51) Int. Cl.
*H01L 21/44* (2006.01)

(52) U.S. Cl. .................... 438/663; 257/616; 257/E21.3; 257/E29.068

(58) Field of Classification Search .............. 257/616, 257/E21.3, E29.068; 438/663
See application file for complete search history.

(56) References Cited

U.S. PATENT DOCUMENTS

| 6,365,446 B1 * | 4/2002 | Chong et al. .................. 438/197 |
| 2007/0123042 A1 | 5/2007 | Rim et al. |
| 2007/0272955 A1 * | 11/2007 | Chi et al. ...................... 257/288 |

FOREIGN PATENT DOCUMENTS

| EP | 1763084 A2 | 3/2007 |
| WO | WO2006/011851 A1 | 2/2006 |

OTHER PUBLICATIONS

D. Brunco et al. "Germanium MOSFET Devices: Advances in Material Understanding, Process Development, and Electrical Performance" published in Journal of Electrochemical Society 155(7) H552-H561 (2008).
Brunco, D.P. et al., "Germanium MOSFET Devices: Advances in Materials Understanding, Process Development, and Electrical Performance", Journal of the Electrochemical Society, 155 (7) pp. H552-H561 (2008).
European Search Report, European Patent Application No. 08163442.0 dated Dec. 27, 2011.

(Continued)

*Primary Examiner* — Kimberly Rizkallah
*Assistant Examiner* — Marvin Payen
(74) *Attorney, Agent, or Firm* — McDonnell Boehnen Hulbert & Berghoff LLP

(57) ABSTRACT

The present invention is related to the field of semiconductor processing and, more particularly, to the formation of low resistance layers on germanium substrates. One aspect of the present invention is a method comprising: providing a substrate on which at least one area of a germanium layer is exposed; depositing over the substrate and said germanium area a metal, e.g., Co or Ni; forming over said metal, a capping layer consisting of a silicon oxide containing layer, of a silicon nitride layer, or of a tungsten layer, preferably of a $SiO_2$ layer; then annealing for metal-germanide formation; then removing selectively said capping layer and any unreacted metal, wherein the temperature used for forming said capping layer formation is lower than the annealing temperature.

25 Claims, 3 Drawing Sheets

OTHER PUBLICATIONS

Zhu, Shiyang et al., "Enhanced Thermal Stability of Nickel Germanide on Thin Epitaxial Germanium by Adding an Ultrathin Titanium Layer", Applied Physics Letters, vol. 91, 2007, pp. 051905-1-051905-3.

Thompson, Michael O. et al., "Melting Temperature and Explosive Crystallization of Amorphous Silicon During Pulsed Laser Irradiation", Physical Review Letters, vol. 52, No. 26, Jun. 25, 1984, pp. 2360-2363.

H.B. Yao et al., "Interplay Between Grain Boundary Grooving, Stress, and Dealloying in the Agglomeration of $NiSi(1-x) Ge(x)$ Films," Electrochem. and Solid-State Letts., 10, H53-H55 (2007).

M.O. Thompson et al., "Melting Temperature and Explosive Crystallization of Amorphous Silicon during Pulsed Laser Irradiation," Phys. Rev. Letts., 52, 2360-64 (1984).

* cited by examiner

METHODS FOR FORMING METAL-GERMANIDE LAYERS AND DEVICES OBTAINED THEREBY

CROSS-REFERENCE TO RELATED APPLICATIONS

This application claims priority under 35 U.S.C. §119 to European Patent Application no. 07115482.7, filed Aug. 31, 2007, which is hereby incorporated herein by reference in its entirety.

FIELD OF THE INVENTION

The present invention is related to the field of semiconductor processing and, more particularly, to the formation of low resistance layers on germanium substrates.

BACKGROUND OF THE INVENTION

Due to its electronic properties, germanium is considered to be a replacement for silicon as the semiconductor material of choice to form substrates and/or gate electrodes.

Germanides, e.g. compounds resulting from the reaction between germanium and a metal, such as Ni, are attractive for use in Ge-based integrated circuits to reduce the resistivity of source and drain regions.

However, a fully manufacturable process for germanidation has yet to be developed.

Self-aligned germanides have already been described. Generally, such self-aligned germanides can be formed by depositing a layer of metal over a substrate and a germanium region, heating the structure to form a metal germanide and selectively removing unreacted metal, e.g. using a selective etching technique.

However, the methods that were available before the present invention result in several types of lethal defects, including pits in the Ge and/or the formation of a conductive germanide excrescence (unwanted accretion) over areas intended for isolation.

SUMMARY OF THE INVENTION

One aspect of the present invention is a method for the formation of a metal-germanide layer in a semiconductor device, the method comprising:
  providing a substrate on which at least one area of a germanium layer is exposed,
  depositing over the substrate and said germanium area a metal, e.g., Co or Ni,
  forming over said metal, a capping layer consisting of a silicon oxide containing layer, of a silicon nitride layer, or of a tungsten layer, e.g., a $SiO_2$ layer,
  then annealing for metal-germanide formation,
  then removing selectively said capping layer and any unreacted metal,
wherein the temperature used for forming said capping layer formation is lower than the annealing temperature.

In one embodiment, a method according to the invention further comprises, after removal of said unreacted metal, a second annealing step.

In one embodiment of the invention, said germanium layer can be deposited (or formed) over the entire substrate (covering completely said substrate). Alternatively, said germanium layer can be deposited (or formed) locally on the substrate, covering partially said substrate.

In one embodiment of the invention, on said substrate, said Ge layer contacts (or touches) another exposed area (or layer) of a material selected from the group consisting of a dielectric material, a metal such as TiN or TaN, a polymer capable of withstanding required process temperatures, and wherein said different exposed materials do not react with the metal used for germanidation. For example, in one embodiment of the invention, the different exposed materials do not react with Ni when the metal used comprises (or consists) of Ni.

In one embodiment of the invention, said other exposed material is a dielectric material. For example, said other exposed material can be $SiO_2$.

In one embodiment of the invention, said dielectric material (other exposed material) can be used for or in the form of a field isolation region or a spacer.

In one embodiment of the invention, said annealing step(s) consist(s) of Rapid Thermal Process (RTP) step(s). Said annealing step(s) can be performed in a batch furnace, such as a horizontal or vertical diffusion furnace.

Said annealing step(s) can be performed, for example, in an inert ambient such as nitrogen.

In one embodiment of the invention, said capping layer consists of or consists essentially of TiN.

In another embodiment of the invention, said capping layer consists of or consists essentially of TaN.

In one embodiment of the invention, said capping layer is deposited by a CVD technique or by a spin-on deposition technique.

In one embodiment of the invention, a capping layer comprising, or consisting of, silicon nitride is deposited by a PECVD technique.

In one embodiment of the invention, said capping layer is less than (about) 100 nm thick, less than (about) 50 nm, less than (about) 20 nm, or even less than (about) 15 nm. For example, said capping layer can be about 10 nm in thickness.

For example, said capping layer can have a thickness in the range of (about) 1 nm to (about) 100 nm, in the range of (about) 2 nm to (about) 50 nm, in the range of (about) 5 nm to (about) 20 nm, or in the range of (about) 7 nm to (about) 15 nm. For example, the capping layer can have a thickness in the range of (about) 10 nm to (about) 15 nm.

In one embodiment of the invention, said step of removing said capping layer is a wet process step.

In one embodiment of the invention, said step of removing the unreacted metal is a wet process step.

In one embodiment of the invention, said step of removing said capping layer and said step of removing the unreacted metal can be performed simultaneously (e.g., in one step). In other embodiments of the invention, the steps of removing the capping layer and the step of removing the unreacted metal can be formed in sequence. For example, removing selectively said capping layer and any unreacted metal can comprise removing selectively the capping layer then removing selectively any unreacted metal.

In one embodiment of the invention, said metal can be any metal suitable for germanidation in a semiconductor device. For example, said metal can comprise nickel, cobalt, platinum and/or palladium. In one embodiment of the invention, the metal consists of or consists essentially of nickel, cobalt, platinum and/or palladium.

For example, in one embodiment of the invention, said metal comprises Ni, more particularly comprises more than about 90% Ni, and even more preferably said metal consists of or consists essentially of Ni.

In one embodiment of the invention in which said metal comprises, consists of or consists essentially of nickel, the temperature used for said capping layer formation is lower than (about) 300° C., lower than (about) 260° C., lower than (about) 250° C., or even lower than (about) 225° C.

In one embodiment of the invention where said metal comprises (or more particularly consists of) nickel, said annealing temperature(s) is/are higher than (about) 300° C. For example, the annealing temperature(s) can be in the range of (about) 300° C. to (about) 450° C., in the range of (about) 325° C. to (about) 400° C., or in the range of (about) 350° C. to (about) 400° C.

In one embodiment of the invention in which said metal comprises, consists of or consists essentially nickel, a first annealing step is performed at a temperature in the range of (about) 205° C. to (about) 325° C., in the range of (about) 210° C. to (about) 275° C., or in the range of (about) 230° C. to (about) 270° C.; and a second annealing step is performed at a temperature in the range of (about) 300° C. to (about) 550° C., or in the range of (about) 325° C. to (about) 400° C.

In certain embodiments of the invention, the method can be used for improving the metal-germanide layer properties. For example, in certain embodiments of the invention, the methods prevent (or reduce) defects (e.g., pits, overgrowth, or excrescences) in the metal-germanide layer.

In certain embodiments of the invention, method can be used for improving the metal-germanide layer formation, in particular its morphology, in a semiconductor device.

Another aspect of the present invention is a semiconductor device made by a method comprising:
providing a substrate on which at least one area of a germanium layer is exposed,
depositing over the substrate and said germanium area a metal, e.g., Co or Ni,
forming over said metal, a capping layer consisting of a silicon oxide containing layer, of a silicon nitride layer, or of a tungsten layer, preferably of a SiO$_2$ layer,
then annealing for metal-germanide formation,
then removing selectively said capping layer and any unreacted metal,
wherein the temperature used for forming said capping layer formation is lower than the annealing temperature.

BRIEF DESCRIPTION OF THE DRAWINGS

Various embodiments are described herein with reference to the following drawings. Certain aspects of the drawings are depicted in a simplified way for reason of clarity. Not all alternatives and options are shown in the drawings and, therefore, the invention is not limited in scope to the content of the drawings. Like numerals are employed to reference like parts in the different figures.

DETAILED DESCRIPTION

Figure 1:
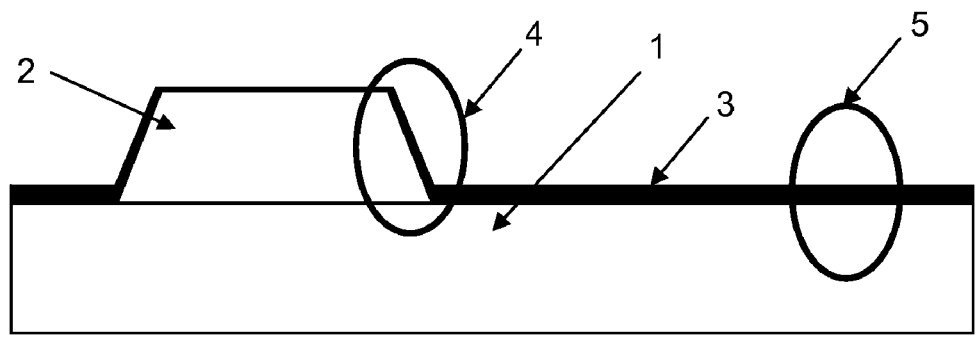
FIG. 1 shows a cross section of a germanium substrate (1), with an isolation structure (Box isolation) (2) and a Ni layer (3) deposited over said germanium substrate and said isolation structure. The circles (4, 5) define two different areas where the germanidation give different results in term of quality of the germanide layer obtained. The Box isolation is formed by depositing and patterning a SiO$_2$ layer on the substrate.

The present invention is based on the surprising discovery that carrying out a method of the invention, comprising the formation of a SiO$_2$ capping layer on Ni and Ge layers before annealing and its selective removal, leaves a surface that is free of pits in the Ge layer and free of nickel-germanide overgrowth, and provides a nickel-germanide layer that exhibits a lower sheet resistance.

In the context of the present invention, the term "RTP step" is used in a generic sense, referring to semiconductor device processing, wherein the temperature is rapidly increase, e.g. involving heating rates higher than 10° C./s, and wherein the heating means include, but are not limited to, resistive wiring, halogen lamps, flash lamps, and lasers.

In the context of the present invention, the term "RTP tool" is also used in a generic sense, referring to any semiconductor process tool capable of rapid heating rates (e.g. higher than 10° C./s) including, but not limited to, systems heated by resistive wiring, halogen lamps, flash lamps, and lasers.

One aspect of the present invention is a method for forming a metal-germanide layer in a semiconductor device comprising the steps of:
providing a substrate on which at least one area of a germanium layer is exposed,
depositing over the substrate and said germanium area, a metal, e.g., Co or Ni,
forming over said metal, a capping layer consisting of a silicon oxide containing layer, of a silicon nitride layer, or of a tungsten layer, e.g., a SiO$_2$ layer,
then annealing for metal-germanide formation,
then removing selectively said capping layer and any unreacted metal,
wherein the temperature used for said capping layer formation is lower than the annealing temperature.

In certain embodiments of the invention, the method can be used for improving the metal-germanide layer properties. For example, in certain embodiments of the invention, the methods prevent (or reduce) defects (e.g., pits, overgrowth, or excrescences) in the metal-germanide layer.

Said substrate can be any substrate with a Ge-based active layer, including bulk germanium wafers, germanium-on-insulator wafers, and deposited Ge layers on other substrates like silicon.

In certain embodiments of the invention, said substrate comprises an exposed germanium area bordering (or contacting) a dielectric area.

The dielectric area can be, for example, a field isolation region or a spacer.

A height difference, or topographical step, can exist between the exposed surfaces of the germanium region and the dielectric region. The substrate can be a patterned wafer comprising germanium active areas separated by isolation regions. Said isolation regions, also referred to as field isolation regions, can be formed by one of several techniques such as box isolation or shallow-trench-isolation (STI).

In certain embodiments of the invention, e.g., in the case of Box isolation, openings are formed, by dry or wet etch, in an oxide layer overlying a germanium layer to expose regions of this germanium layer. This way, SiO$_2$ isolation between germanium active areas can be obtained by depositing and patterning SiO$_2$ layers on the germanium surface.

In one embodiment of the invention, e.g., in the case of shallow-trench-isolation, grooves formed by dry-etch in the substrate are filled with a dielectric layer providing electrical insulation.

The germanium layer can be in an amorphous or crystalline state.

The germanium layer of the exposed region can comprise some amount of other materials suitable in semiconductor processing. For example, the germanium layer may comprise semiconductor materials such as silicon.

For example, when the germanium layer is formed by using a germanium condensation technique, up to about 15% silicon can be present in the thus formed germanium layer.

The germanium layer may comprise (or may further comprise) one or more dopants such as arsenic, phosphorus, antimony, boron, and gallium. The germanium layer may also comprise (or may also further comprise) other commonly used elements in semiconductor processing like carbon (C) and fluorine (F). The germanium layer may also comprise (or may also further comprise) nitrogen (N).

In one embodiment of the invention, the germanium layer can be deposited (or formed) over the entire substrate (covering completely the substrate). Alternatively, the germanium layer can be deposited (or formed) locally on the substrate, partially covering the substrate.

The germanium active area can comprise one or more semiconductor devices.

If the semiconductor device is a field-effect-transistor, the germanium active area can comprise a stack of a gate electrode and a gate dielectric. This gate stack is formed on the germanium substrate, thereby, defining the channel region.

The gate dielectric can be an oxide, a nitrided oxide, an oxynitride or a high-κ dielectric (i.e. κ>κ(SiO$_2$)) such as a hafnium oxide or an aluminum oxide.

The gate electrode can be formed from a semiconductor material such as polysilicon, silicon-germanium, germanium, or from a metallic material such as TiN, TaN, and W.

The gate stack separates in a lateral direction the source electrode and the drain electrode, which contact at opposite lateral sides the channel region.

Against the gate stack, dielectric sidewall spacers can be formed to offset the source and drain regions from the channel region. These sidewall spacers can be formed for example from silicon-oxide, silicon-nitride, and/or silicon-carbide.

In one embodiment of the invention, said metal layer is deposited over the substrate.

In certain embodiments of the invention the metal layer comprises (or consists of) any suitable metal, and more particularly nickel (Ni), or cobalt (Co).

Alloys of said metals can also be used in a method of the invention. Preferably, the alloys comprise (about) 50% or more of said metal.

Preferably, said metal comprises nickel, and in particular more than (about) 50% nickel, preferably more than (about) 90% nickel. More preferably, the metal consists of nickel.

Said metal can comprise, or can further comprise, or can consist of or consist essentially of platinum (Pt) and/or palladium (Pd). In particular, said metal can comprise (or consist of or consist essentially of) platinum, palladium and nickel. More particularly, said metal can comprise (or consist of or consist essentially of) palladium and nickel, e.g., (about) 90% nickel and (about) 10% palladium.

The metal layer can be deposited using any layer deposition techniques known in the art, e.g., chemical vapor deposition, or sputter deposition.

The thickness of the metal layer can be selected to obtain, after completion of the germanide-forming process, a germanide layer with the desired metal/germanium ratio and the desired thickness.

In one embodiment of the invention, said capping layer can consist of (or consist essentially of) a silicon oxide containing material, such as silicon oxynitride (SiON), referring herein to a material made of silicon, oxygen and nitrogen; carbonaceous silicon oxide (SiOC), referring herein to a material made of silicon, oxygen and carbon; or fluorinated silicon oxide (SiOF), referring herein to a material made of silicon, oxygen and fluorine.

In certain embodiments of the invention, said capping layer consists of (or consists essentially of) SiO$_2$.

Alternatively, in one embodiment of the invention, said capping layer can consist of (or consist essentially of) a silicon nitride layer, referring herein to a material made of silicon and nitrogen. More particularly, said capping layer can consist of a Si$_3$N$_4$-like (also referred to as Si$_x$N$_y$, or also referred to as impure Si$_3$N$_4$) material, referring herein to a material made (essentially) of silicon and nitrogen, wherein x is different from 3 and y different from 4. Said capping can consist of Si$_3$N$_4$, but pure Si$_3$N$_4$ can be more difficult to remove selectively than Si$_3$N$_4$-like material.

Alternatively, in one embodiment of the invention, said capping layer can consist of (or consist essentially of) a tungsten (W) layer.

Alternatively, in one embodiment of the invention, said capping layer can consist of (or consist essentially of) a titanium nitride (TiN) layer.

Alternatively, in one embodiment of the invention, said capping layer can consist of (or consist essentially of) a tantalum nitride (TaN) layer.

In one embodiment of the invention, said capping layer is deposited at a temperature lower than the annealing temperature set for germanidation.

Said capping layer can be deposited by any suitable process known in the art, e.g., by a CVD process, or by a sputter deposition process.

Further examples of deposition techniques include Plasma Enhanced Chemical Vapor Deposition (PECVD), Atomic Layer CVD (also known as Atomic Layer Deposition), Atomic Vapor Deposition and Metal Organic CVD (MOCVD).

Examples of deposition techniques also include Physical Vapor Deposition (PVD), e.g., sputtering, evaporation, molecular beam epitaxy (or deposition) (MBE), or jet vapor deposition.

Examples of deposition techniques also include wet processes, such as spin-on deposition or electroplating.

In certain embodiments of the invention, said capping layer has a thickness of less than (about) 100 nm, less than (about) 50 nm, less than (about) 20 nm, or less than (about) 15 nm. For example, the thickness of the capping layer can be about 10 nm.

For example, said capping layer can have a thickness in the range of (about) 1 nm to (about) 100 nm, in the range of (about) 2 nm to (about) 50 nm, in the range of (about) 5 nm to (about) 20 nm, or in the range of (about) 7 nm to (about) 15 nm. For example, the capping layer can have a thickness in the range of (about) 10 nm to (about) 15 nm.

In certain embodiments of the invention, said annealing step(s) (for germanidation) is/are performed in a thermal processing tool, e.g. in an RTP tool or a batch furnace, such as a horizontal or vertical diffusion furnace. For example, said annealing step(s) can be performed in an RTP tool.

In one embodiment of the invention, said capping layer can be selectively removed by any suitable techniques known in the art.

For example, said capping layer can be selectively removed by wet etching, for example using a composition comprising hydrofluoric acid (HF). For example, the capping layer can be selectively removed using a dilute solution of HF (e.g. a 0.03 M HF solution).

In one embodiment of the invention, if $SiO_2$ is used as capping layer, the selective removal can be performed using a composition comprising hydrofluoric acid (HF), for example diluted with water (e.g., with an HF concentration in the range of 0.03 to 2 vol. %, or 0.03 to 2 wt %). Buffering agents, such as ammonium fluoride ($NH_4F$), can also be added.

In one embodiment of the invention, if W is used as capping layer, the selective removal can be performed by dry etch below 100° C., e.g., using $BCl_3$. A selective removal can also be performed by wet etch.

In one embodiment of the invention, if TiN is used as capping layer, the selective removal can be performed by a wet sulfuric acid etch. A wet sulfuric acid etch can allows the removal of TiN and unreacted Ni selectively with respect to Ge.

In one embodiment of the invention, the removal of any unreacted metal can be performed by any suitable techniques known in the art. The metal removal conditions can be selective for the metal, or can be selective to remove both any unreacted metal and the capping layer.

Conditions for the metal removal step depend upon the deposited metal and the other materials present on the substrate.

D. Brunco et al. discloses in "Germanium MOSFET Devices: Advances in Material Understanding, Process Development, and Electrical Performance" published in Journal of Electrochemical Society 155(7) H552-H561 (2008), hereby incorporated by reference in its entirety, in table I the etch speed of germanium for various etch chemistries. Chemistries for the selective removal of the cap and unreacted metal can have zero to low (<1 nm/min) etch rates of germanium.

In certain embodiments of the invention, said metal is selectively removed by wet etching.

For example, said metal can be selectively removed using a composition comprising an aqueous solution of at least one hydrohalide selected from the group consisting of HF, HCl, HBr and HI. Said composition can further comprise a solution of $H_2SO_4$, and/or a solution of $NH_4OH$, and/or a solution of $H_3PO_4$.

Said composition can further comprise a solution of $HNO_3$. For example, said composition can comprise HCl and $HNO_3$.

In certain embodiments of the invention, the metal can be selectively removed using a composition comprising hydrochloric acid (HCl), more particularly using a dilute solution of HCl (e.g. 10 vol % HCl solution, at 55° C.).

In one embodiment of the invention, the method comprises a second annealing step, after the removal of any unreacted metal. In such an embodiment, the first annealing temperature is preferably in the range of (about) 200° C. to (about) 400° C., or in the range of (about) 200° C. to (about) 325° C., and the first annealing time period is less than 300 seconds, for example in the range of (about) 1 millisecond to (about) 300 seconds, or in the range of (about) 10 seconds to (about) 60 seconds.

Preferably, the temperature of said first thermal step (or first annealing temperature) is in the range of (about) 205° C. to (about) 325° C., in the range of (about) 210° C. to (about) 275° C., or in the range of (about) 230° C. to (about) 270° C.

The temperature of the second thermal step (or second annealing temperature) can be, for example, in the range of (about) 280° C. to (about) 550° C., e.g. for a time period of less than (about) 600 seconds, preferably in the range of (about) 1 millisecond to (about) 300 seconds. The second annealing temperature can be in the range of (about) 300° C. to (about) 550° C., or in the range of (about) 325° C. to (about) 400° C. The person of skill in the art can select the temperature to achieve a resistance of the germanide layer that meets any required specifications.

In certain embodiments of the invention, Ni is the metal used. In such embodiments, the temperature of the capping layer deposition can be lower than (about) 300° C., lower than (about) 250° C., or even lower than (about) 225° C. In such embodiments, the temperature of the annealing step(s) can be higher than (about) 300° C. Preferably, the temperature of said annealing step(s) is in the range of (about) 300° C. to (about) 550° C., in the range of (about) 325° C. to (about) 400° C., or even in the range of (about) 350° C. to (about) 400° C. Said temperatures can be reached and maintained for a total time period of less than (about) 600 seconds, for example in the range of (about) 1 millisecond to (about) 300 seconds.

In certain embodiments of the invention in which Ni is the metal, the method can comprise a first annealing step (between the step of forming, over Ni, said capping layer and the step of removing selectively said capping layer) and a second annealing step (after the step of selectively removing said unreacted Ni). The first annealing step can be performed at a temperature in the range of (about) 205° C. to (about) 325° C., in the range of (about) 210° C. to (about) 275° C., or in the range of (about) 230° C. to (about) 270° C. The second annealing step can be performed at a temperature in the range of (about) 300° C. to (about) 550° C., or in the range of (about) 325° C. to (about) 400° C.

The deposition of said capping layer can involve a temperature that allows the conversion of said Ni into a nickel-germanide to begin (between about 250° and 300° C.). Thus, the nickel-germanide formed during the deposition of said capping layer would comprise nickel-rich germanide phases, e.g., $Ni_5Ge_3$. In that case, the annealing step can complete the reaction, for example, such that the germanide phase is essentially a mono nickel-germanide phase (NiGe). In such a case, the capping layer can still plays a protecting role, and can result in a device free of defects.

The Ni can be removed using any suitable techniques known in the art.

For instance, a composition comprising nitric acid ($HNO_3$), sulfuric acid ($H_2SO_4$), and water ($H_2O$) can be used, e.g., at room temperature. The concentration by volume of the nitric acid may be 0.1%, the concentration by volume of the sulfuric acid may be 52.9%, and the concentration by volume of the water may be 47%.

In certain embodiments of the invention, said Ni is selectively removed by wet etching, for example using a composition comprising hydrochloric acid (HCl). The Ni can be removed, for example, using a dilute solution of HCl (e.g. 10 vol % HCl solution, at 55° C.).

In certain embodiments of the invention, Ni is the metal used and the capping layer consists of $SiO_2$.

Said $SiO_2$ capping layer can be selectively removed by any suitable techniques known in the art.

Preferably, said $SiO_2$ capping layer is selectively removed by wet etching, for example using a composition comprising hydrofluoric acid (HF), e.g., a dilute solution of HF (e.g. 0.03 M HF solution).

In embodiments in which Ni is the metal used and the capping layer consists of $SiO_2$, any unreacted nickel and the $SiO_2$ capping layer can be selectively removed in one step. For example, said unreacted nickel and said $SiO_2$ capping layer can be removed using a composition comprising both HCl and HF. In other embodiments of the invention, however, the removal of the unreacted nickel and the removal of the $SiO_2$ capping layer are sequential, using respectively a dilute HF solution for $SiO_2$ removal and then a dilute HCl solution for nickel removal.

The person of skill in the art can use the methods of the present invention to form a substrate, comprising a metal-germanide formed on a germanium area bordering a dielectric region (2, 4 in FIG. 1), in which essentially no pits are present in the germanium area near the germanium-dielectric region (4) and essentially no undesirable germanide is present on the dielectric region (2, 4).

In FIG. 1, a cross-section is shown of a germanium substrate (1), an isolation region (2) and a metal layer (3), with the indication of the bordering region (4), illustrating a method of the invention before the deposition of the capping layer. The region (5) is remote from the Box isolation.

Figure 2:
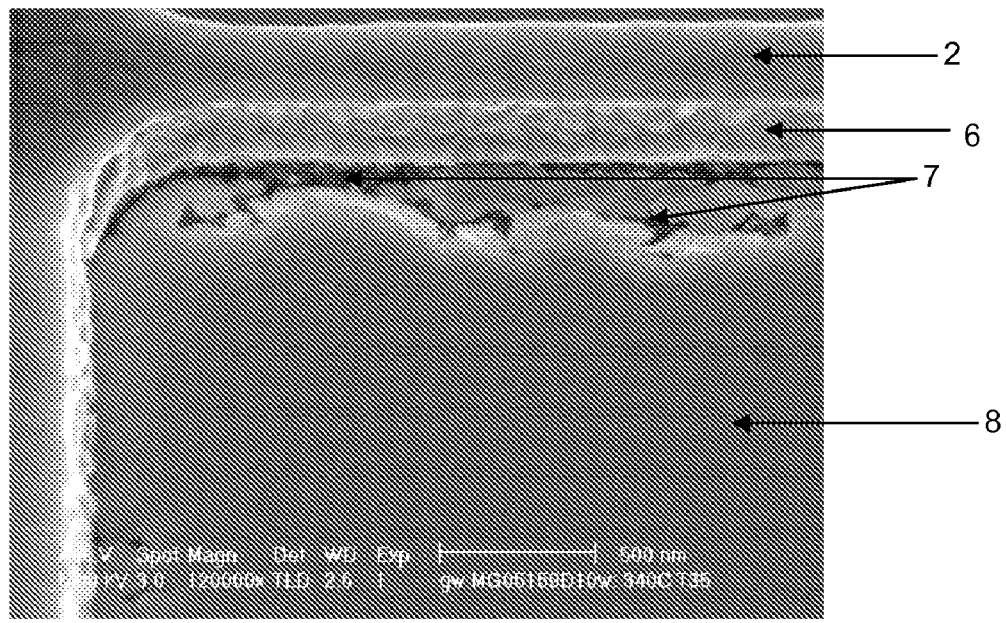
FIG. 2 shows a Scanning Electron Microscope (SEM) picture of a nickel-germanide formed at 330° C., 30 sec (or at 360° C., 30 sec, or at 340° C., 35 sec), obtained according to a prior art process, exhibiting pits in the Ge layer, and germanide overgrowth on the Box isolation.

FIG. 2 shows a Scanning Electron Microscope (SEM) picture of a nickel-germanide layer formed on a patterned substrate, according to a prior art method. About 10 nm of nickel was deposited on a substrate containing exposed germanium surfaces, bordering a dielectric region. This substrate was heated to about 360° C. for about 30 sec. Unreacted nickel was selectively wet etched from the substrate. A very similar result is obtained when heated to about 340° C. for about 35 sec.

This picture was taken from the germanided surface of the substrate, which was tilted to 35°. This picture clearly shows the pits (7) created in the active area (8), near the isolation region (2). Besides the pits (7), germanide overgrowth (6) can be observed on the isolation region.

Figure 3:
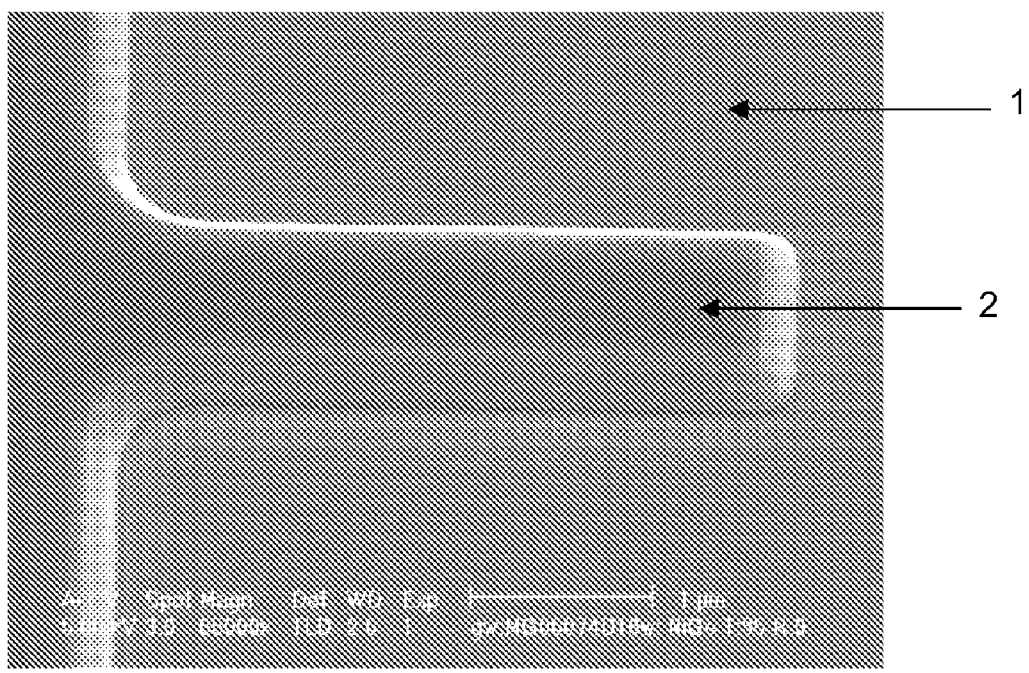
FIG. 3 shows a SEM picture of a nickel-germanide formed at 330° C., 30 sec, obtained according to a method of the invention, with no defects (no pit, no overgrowth). Very similar results are obtained carrying out a method of the invention with a nickel-germanide formed at 340° C., 35 sec, or at 350° C., 30 sec.

FIG. 3 shows a Scanning Electron Microscope (SEM) picture of a nickel-germanide layer formed on a patterned substrate, after having carried out a method according to one embodiment of the invention (see example 2).

Figure 4:
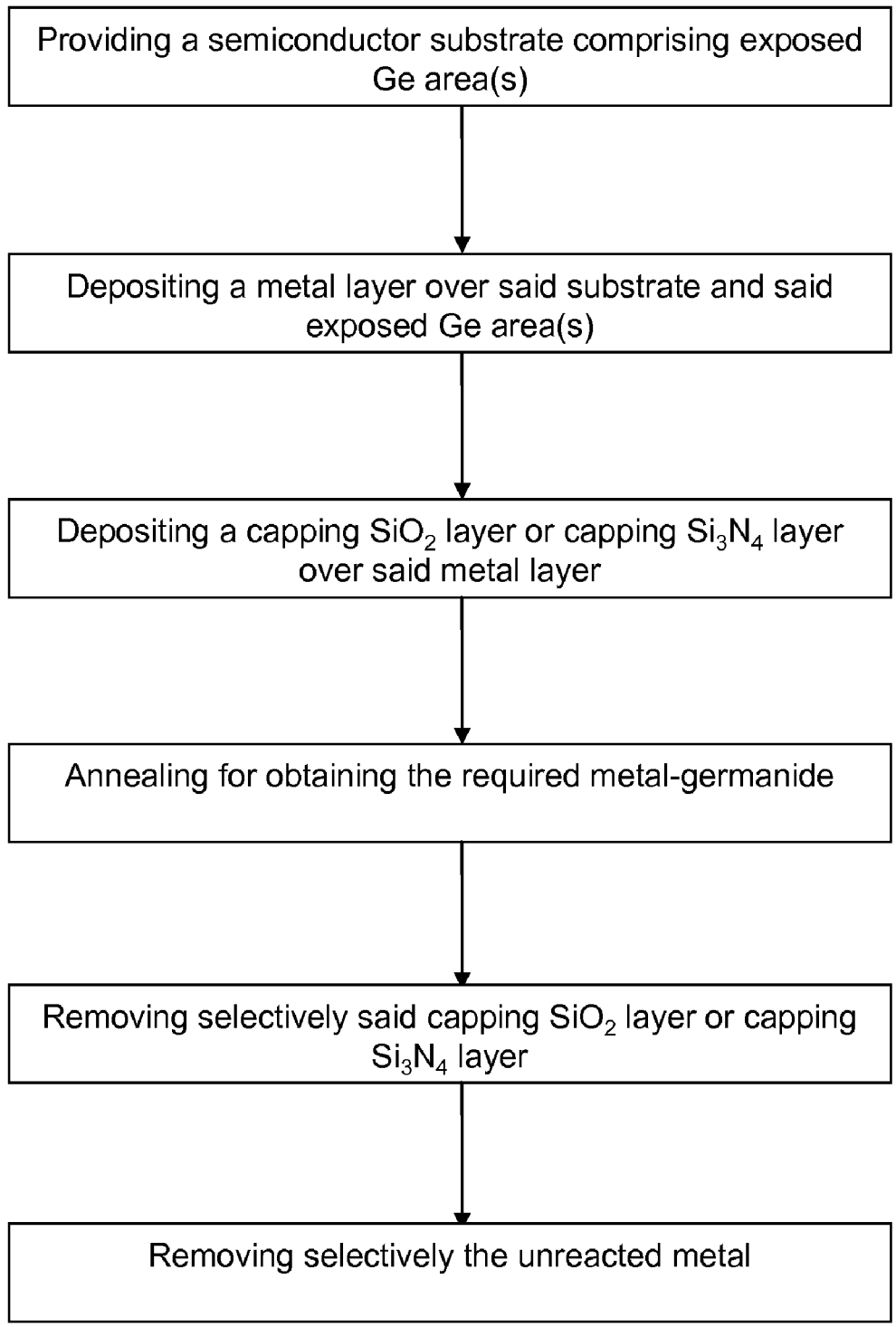
FIG. 4 is a flowchart illustrating a germanide-forming process according to one embodiment of the present invention.

FIG. 4 is a flowchart illustrating a process for forming a germanide layer according to the invention.

EXAMPLES

Example 1

Epitaxial Ge layers are grown on Si wafers (using an ASM® epitaxial reactor).
A 10 nm thick Ni layer is deposited over the Ge layer.
A 10 nm thick $SiO_2$ capping layer is formed at 250° C.
The unreacted Ni and the $SiO_2$ capping layer are removed by dipping in a bath consisting of a mixture of dilute HCl solution and dilute HF solution.
All anneals are performed in AST® tool.
With an annealing temperature of 330° C., the $SiO_2$ capping layer suppresses Ge pits and overgrowth on the Box isolation. Moreover, the resistance sheet measured is lower than the one measured without the $SiO_2$ capping layer.
A similar result is observed when applying an annealing temperature of 350° C.

Example 2

Epitaxial Ge layers are grown on Si wafers (using an ASM® epitaxial reactor).
A 10 nm thick Ni layer is deposited over the Ge layer.
A 10 nm thick or a 20 nm thick $SiO_2$ capping layer is formed either at 200° C. or at 250° C.
The unreacted Ni and the $SiO_2$ capping layer are removed by dipping in a bath consisting of a mixture of dilute HCl solution and dilute HF solution.
All anneals are performed in AST® tool at a temperature of 330° C.
When compared with the sample obtained without $SiO_2$ capping layer, the samples with the $SiO_2$ capping layer have almost no defect and exhibit a much lower resistance sheet.

Example 3

Epitaxial Ge layers are grown on Si wafers (using an ASM® epitaxial reactor).
In this example, the epitaxial germanium layer is relaxed (or unstrained) and about 1.7 μm thick.
Isolation regions are formed by depositing and patterning a silicon oxide layer on a germanium surface thereby forming of a patterned layer of 250 nm thick $SiO_2$.
A cleaning step is performed consisting of a water rinse, which dissolves germanium oxides.
A 10 nm thick Ni layer is deposited over the Ge layer.
Said Ni layer is deposited by Physical Vapor Deposition (PVD), also known as sputtering.
A 10 nm thick $SiO_2$ capping layer is formed at 250° C.
Said $SiO_2$ capping layer is formed using Plasma Enhanced Chemical Vapor Deposition (PECVD) with $SiH_4$ and $N_2O$ precursors.
The unreacted Ni and the $SiO_2$ capping layer are removed by dipping in a bath consisting of a mixture of dilute HCl solution and dilute HF solution.
All anneals are performed in AST® RTP tool.
With an annealing temperature of 330° C., the $SiO_2$ capping layer suppresses Ge pits and overgrowth on the isolation region (2). Moreover, the resistance sheet measured is lower than the one measured without the $SiO_2$ capping layer.
A similar result is observed (for topography and sheet resistance) when applying an annealing temperature of 340° C., or 350° C. for about 30 sec.

Example 4

Epitaxial Ge layers are grown on Si wafers (using an ASM® epitaxial reactor).
In this example, the epitaxial germanium layer is relaxed (or unstrained) and about 1.7 μm thick.
Isolation regions are formed by depositing and patterning a silicon oxide layer on a germanium surface thereby forming of a patterned layer of 250 nm thick $SiO_2$.
A cleaning step is performed consisting of a water rinse, which dissolves germanium oxides.
A 10 nm thick Ni layer is deposited by over the Ge layer.
Said Ni layer is deposited by PVD.
A 10 nm thick or a 20 nm thick $SiO_2$ capping layer is formed either at 200° C. or at 250° C.
Said $SiO_2$ capping layer is formed using PECVD.
The unreacted Ni and the $SiO_2$ capping layer are removed by dipping in a bath consisting of a mixture of dilute HCl solution and dilute HF solution.
All anneals are performed in AST® RTP tool at a temperature of 330° C.
When compared with the sample obtained without $SiO_2$ capping layer, the samples with the $SiO_2$ capping layer have almost no defect and exhibit an equivalent or a lower sheet resistance.

What is claimed is:
1. A method for forming a layer in a semiconductor device, the metal germanide layer comprising nickel, the method comprising:
providing a substrate on which at least one area of a germanium layer is exposed, depositing over the substrate and said germanium area, a metal comprising nickel, forming over said metal, a capping layer consisting of a silicon oxide containing layer, or of a silicon nitride layer, then thermally annealing for formation of the metal germanide comprising nickel at a first annealing temperature in the range of about 200° C. to about 550° C., then removing selectively said capping layer and any unreacted metal, wherein the capping layer is formed at a temperature that is lower than the first annealing temperature.

2. A method according to claim 1 further comprising a second annealing step after removal of said unreacted metal, the second annealing step being performed at a second annealing temperature.

3. A method according to claim 1, wherein, on said substrate, said Ge layer contacts another exposed area of a material selected from the group consisting of a dielectric material, a metal, a polymer capable of withstanding required process temperatures, and wherein said different exposed materials do not react with Ni.

4. A method according to claim 3, wherein said other exposed material is $SiO_2$.

5. A method according to claim 4, wherein said dielectric material is used for or in the form of a field isolation region or a spacer.

6. A method according to claim 1, wherein said annealing step(s) consist(s) of Rapid Thermal Process (RTP) step(s).

7. A method according to claim 1, wherein said annealing step(s) is/are performed in a batch furnace.

8. A method according to claim 6 or 7, wherein said annealing step(s) is/are performed in an inert ambient.

9. A method according to claim 1, wherein said capping layer is deposited by a CVD technique or by a spin-on deposition technique.

10. A method according to claim 1, wherein said silicon nitride capping layer is deposited by a PECVD technique.

11. A method according to claim 1, wherein said capping layer is less than 100 nm thick.

12. A method according to claim 1, wherein said step of removing said capping layer is a wet process step.

13. A method according to claim 1, wherein said step of removing the unreacted metal is a wet process step.

14. A method according to claim 1, wherein said step of removing said capping layer and wherein said step of removing the unreacted metal are performed simultaneously.

15. A method according to claim 1, wherein said metal for germanidation consists of Ni.

16. A method according to claim 1, wherein said metal for germanidation further comprises cobalt, platinum and/or palladium.

17. A method according to claim 1, wherein said metal comprises 90% nickel and 10% palladium.

18. A method according to claim 1, wherein the temperature used for said capping layer formation is lower than 300° C.

19. A method according to claim 1 wherein said annealing temperature(s) is/are higher than 300° C.

20. A method according to claim 1 wherein the first annealing temperature is in the range of 300° C. to 450° C.

21. A semiconductor device made by a method according to claim 1.

22. A method according to claim 1, wherein the capping layer consists essentially of silicon dioxide.

23. A method according to claim 2, wherein the second annealing temperature is in the range of about 300° C. to about 550° C.

24. A method according to claim 1, wherein the first annealing temperature is in the range of about 300° C. to about 550° C.

25. A method according to claim 1, wherein the first annealing temperature is in the range of about 200° C. to about 400° C.

* * * * *